United States Patent [19]

Kato

[11] 4,267,479
[45] May 12, 1981

[54] MOUNTING CLIPS FOR THICKNESS SHEAR PIEZOELECTRIC OSCILLATOR

[75] Inventor: Toshitake Kato, Tokyo, Japan

[73] Assignee: Citizen Watch Co., Ltd., Tokyo, Japan

[21] Appl. No.: 939,866

[22] Filed: Sep. 5, 1978

[30] Foreign Application Priority Data

Sep. 16, 1977 [JP] Japan ................. 52-111371
Oct. 8, 1977 [JP] Japan ................. 52-121265
May 25, 1978 [JP] Japan ................. 53-62623

[51] Int. Cl.³ .......................................... H01L 41/08
[52] U.S. Cl. ................................. 310/348; 310/351
[58] Field of Search ............... 310/348, 351–356, 310/368

[56] References Cited

U.S. PATENT DOCUMENTS

| | | | |
|---|---|---|---|
| 2,228,601 | 1/1941 | Hawk | 310/355 X |
| 2,471,625 | 5/1949 | Johnstone | 310/353 X |
| 2,575,819 | 11/1951 | Laird | 310/356 |
| 2,641,718 | 6/1953 | Samuelson | 310/355 |
| 2,824,981 | 2/1958 | Warden | 310/355 |
| 2,850,651 | 9/1958 | Hoffman | 310/353 |
| 3,581,126 | 5/1971 | Omlin | 310/352 |
| 3,787,743 | 1/1974 | Gibert et al. | 310/352 |
| 4,104,553 | 8/1978 | Engdahl et al. | 310/352 |
| 4,124,809 | 11/1978 | Engdahl et al. | 310/368 X |
| 4,139,793 | 2/1979 | Michel | 310/353 |

*Primary Examiner*—Mark O. Budd
*Attorney, Agent, or Firm*—Sherman & Shalloway

[57] ABSTRACT

A support construction for a thickness shear piezoelectric oscillator such as a crystal oscillator or the like, which can improve oscillation characteristics thereof. The thickness shear piezoelectric oscillator is provided at its both ends with a so-called bevel portion which is supported at the upper and lower tapered portions thereof by a shaped guide so as to determine the horizontal position thereof.

9 Claims, 28 Drawing Figures

MOUNTING CLIPS FOR THICKNESS SHEAR PIEZOELECTRIC OSCILLATOR

BACKGROUND OF THE INVENTION

1. Field of the Invention

This invention relates to thickness shear piezoelectric oscillators and more particularly to a thickness shear pieoelectric oscillator comprising an elongate rectangular oscillating piece extending in a direction producing a thickness shear displacement and provided at its both ends with a tapered bevel portion, the oscillating piece being supported at upper and lower node points of the bevel portion.

2. Description of the Prior Art

In the above described kind of thickness shear piezoelectric oscillator, it has been the common practice to use such a support construction that an elongate oscillating piece, for example, an elongate crystal piece extends in a direction producing a thickness shear displacement, that is, in an X direction and that the oscillating piece is supported at its both end surfaces by a supporting means for the purpose of obtaining a temperature characteristic at which an excellent resonance frequency is produced. But, in order to make leakage of the oscillation at the supporting points small so as to make a series resonance resistance value (hereinafter will be called as $R_1$ value) small and to obtain a large Q value, a ratio of a length of the oscillating piece to a thickness thereof is required to be the order of 30 to 100, thereby rendering the oscillating piece large in size. In addition, the crystal piece is provided at its both ends with an inclined surface, spherical surface or conical surface portion (hereinafter will be called as a bevel portion). Such bevel portion causes the thickness shear oscillation displacement to concentrate into the center part of the oscillating piece and to be reduced at both ends thereof. As a result, it is possible to make the $R_1$ value somewhat small. But, even though the bevel portion is subjected to the working operation, the good oscillation characteristics could not be obtained unless the above mentioned ratio of the length of the oscillating piece to the thickness thereof is larger than the order of 25. Particularly, it is very difficult to make the conventional thickness shear piezoelectric oscillator small in size to an extent which is adapted to be used for a wrist watch and materialization of such small oscillator has long been awaited in the art.

SUMMARY OF THE INVENTION

In consideration of the above described circumstances, the present invention is intended to provide a superminiature type thickness shear piezoelectric oscillator which can make a ratio of a length of an oscillating piece to a thickness thereof smaller than the order of 15 and hence can make a length of a 4 MHz AT-cut crystal piece having a thickness of 0.4 mm, for examle, shorter than the order of 6 mm and can make a width thereof narrower than 1.6 mm.

The thickness shear piezoelectric oscillator according to the invention is characterized in that provision is made of an elongate rectangular oscillating piece extending in a direction of producing thickness shear displacement and provided at its both ends with a bevel portion and that the oscillating piece is supported at a node point of bending oscillation of the upper and lower surfaces of the bevel portion through a point or line contact by means of a supporting means.

Experimental tests on an oscillating piece composed of an elongate rectangular AT-cut crystal and provided at its both-ends with a bevel portion effected for the purpose of realizing an oscillator which is small in size and hence can be enclosed in an extremely small space such as a wrist watch and which is excellent in frequency temperature characteristics have demonstrated the result that of the conventional support construction in which the end of the bevel portion is supported through a silver point or soldering by wires is applied to the above mentioned miniature type oscillating piece having a small ratio of a length of the oscillating piece to a thickness thereof, it is impossible to avoid an increase of the $R_1$ value. In the above mentioned AT-cut crystal, the $R_1$ value was increased up to the order of 500Ω and the Q value was only decreased to the order of $3 \times 10^4$. Further experimental tests have shown the result that if the bevel portion of the oscillating piece is sandwiched between and supported by upper and lower supporting members each having a small width and the $R_1$ and $Q_1$ values are measured while gradually displacing inwardly the supporting point from the end surface of the bevel portion, there are separately present support points where the thickness shear piezoelectric oscillation characteristic becomes suddenly improved.

Extensive investigations on the reasons why the shear piezoelectric oscillation characteristic becomes suddenly improved by changing the supporting point as described above have resulted in the following mechanism. That is, the bevel portion functions to cause the thickness shear displacement to concentrate into the center part of the oscillating piece. But, the thickness shear displacement necessarily produces a torque due to the principle of action and reaction, thereby always following high degree bending oscillation which is determined by the elastic constant and configuration of the oscillating piece. This high degree bending oscillation is transmitted along the oscillating piece to the end thereof and then leaked out of the support, thereby increasing the $R_1$ value and decreasing the Q value. Particularly, if the oscillating piece is provided at its both ends with the bevel portions, complex bending oscillations are induced in these bevel portions and particularly the maximum displacement occurs at the front end of the bevel portion. This is the reason when the conventional support construction which supports the front end of the bevel portion by the silver point could not obtain a good result.

The present invention is based on the above described bending oscillation of the bevel portion accompanied by the thickness shear oscillation. In the present invention, a node point, that is, an immovable point of the bending oscillation of the bevel portion is found out and this node point is supported by a supporting means. The node point may experimentally be found out or may be found out by analyzing oscillation mode on the basis of finite element method or by a method of using an approximate analytical solution of kinetic equation, etc.

The invention makes use of such method so as to find out the node point of the bevel portion of the oscillating piece and the node point thus found out is supported through a point or line contact by a suitable supporting member, thereby providing a super miniature thickness shear piezoelectric oscillator having a significantly excellent characteristic and most suitable for a wrist watch which is required to be small in size and precise in operation.

A principal object of the invention, therefore, is to provide a super miniature type thickness shear piezoelectric oscillator which can eliminate all of the drawbacks which have been encountered with the prior art techniques and which has significantly excellent oscillation characteristics.

The other objects and advantages of the invention will become apparent from the following detailed description made with reference to the accompanying drawings.

BRIEF DESCRIPTION OF THE DRAWING

FIG. 2b is a front view of the right half of the oscillating piece of FIG. 2a;

FIG. 22a is an end view of a supporting member for a ninth embodiment of a thickness shear piezoelectric oscillator according to the invention;

FIG. 22b is a cross-sectional view of FIG. 22a;

FIG. 25a is a plan view of main parts of a twelfth embodiment of a thickness shear piezoelectric oscillator according to the invention; and FIG. 25b is a cross-sectional view of FIG. 25a.

PREFERRED EMBODIMENT OF THE INVENTION

The invention will now be described in greater detail with reference to the accompanying drawings.

Figure 1:
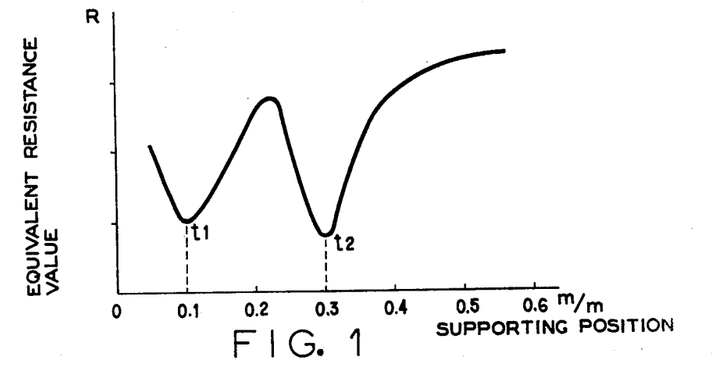
FIG. 1 is a graph illustrating change of equivalent resistance value as a function of supporting position of an oscillating piece.

FIG. 1 is a graph illustrating one example of mode of changing an equivalent resistance value R of an oscillating piece as a function of that supporting position of the oscillating piece which is shown by a distance from the end surface thereof, the equivalent resistance value R being plotted on the ordinate and the supporting position being plotted on the abscissa. In FIG. 1, a first valley $t_1$ shows that the supporting position is distant apart from the end surface of the oscillating piece by 0.1 mm and a second valley $t_2$ shows that the supporting position is distant apart from the end surface of the oscillating piece by 0.3 mm. As shown in FIG. 1, the equivalent resistance value R of the oscillator becomes minimum at these supporting positions, and as a result, a Q value thereof becomes maximum. These supporting positons are, therefore, optimum. These optimum supporting positions are more or less changed in dependence with the configuration of the oscillating piece. Experimental tests have shown the result that a rectangular AT-cut crystal oscillating piece having dimensions of about 6 mm length×about 1.6 mm width×-about 0.4 mm thickness and provided at its both ends with a bevel portion having upper and lower surfaces inclined at 6° to 8° to the center axis of the oscillating piece exhibited the above described first valley at a position distant apart from the end surface of the oscillating piece by 0.08 to 0.12 mm and exhibited the above described second valley at a position distant part from the end surface of the oscillating piece by 0.28 to 0.4 mm.

Figure 2A:
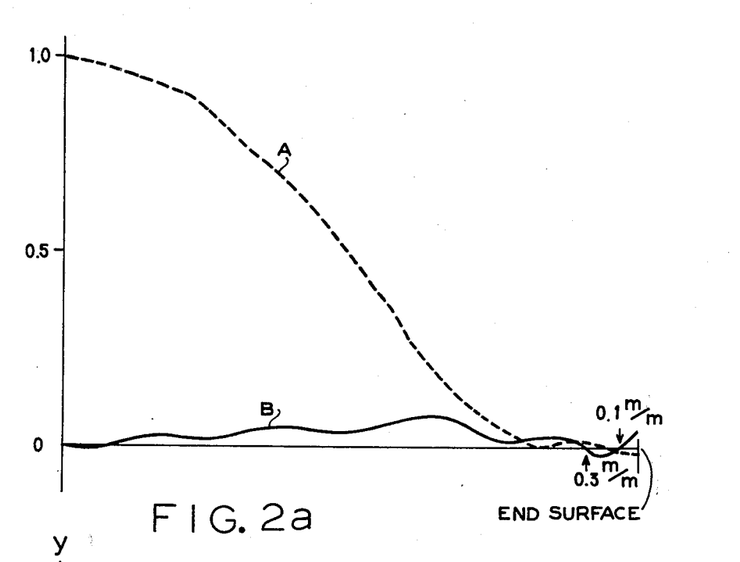
FIG. 2a is a graph illustrating oscillating deviation at various points of an oscillating piece obtained by analysis method.
Figure 2B:
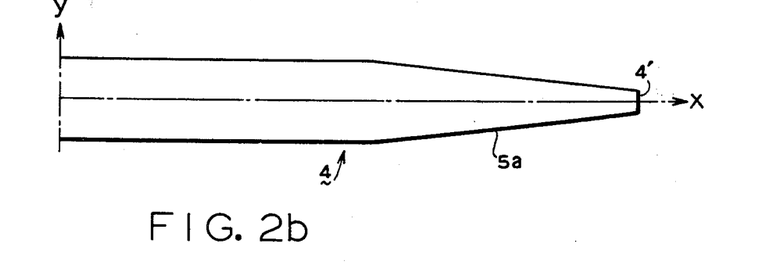

FIG. 2a shows the deviation of an oscillation in a crystal oscillating element 4 shown in FIG. 2b, the results of which is obtained by oscillation analysis method. There are shown analysis data at the right half of the oscillating element 4. A dotted line A shows the deviation at the surface of the oscillating element 4 in the horizontal direction wherein the deviation at the center of the oscillating element 4 is standardized as "1". While a line B shows the deviation of the oscillating element 4 in the vertical direction at the neutral surface of the oscillating element 4 wherein the reference is made "1" like the deviation in the horizontal direction. In line A, it is in points apart, by 0.1 m/m and 0.3m/m, from the end surface 4' of the crystal oscillating element 4 that the deviation in the vertical direction shown by the line B becomes 0. These points correspond to the points where the equivalent resistance value R becomes minimum. As the result, the point is found out at which the deviation of the oscillating element 4 in the vertical and horizontal directions becomes nearly 0 so that the point of the oscillating element 4 is supported, and thereby the supporting loss being made minimum. As the result, the invention can embody a highly efficient crystal oscillating element 4 with a high Q value and a low equivalent resistance value.

Figure 3:
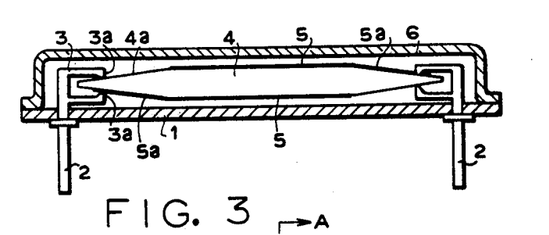
FIG. 3 is a cross-sectional view of a first embodiment of a thickness shear piezoelectric oscillator according to the invention.

FIG. 3 is a cross-sectional view of one embodiment of a thickness shear piezoelectric oscillator according to the invention. Reference numeral 1 designates an insulating base plate formed of ceramic, glass or the like and provided with two lead terminals 2 hermetically extending through and firmly secured to the insulating base plate 1. The lead terminal 2 is provided at its upper part with a channel-shaped support 3 terminated at opposed pointed ends 3a, 3a. Provision is made of an elongate rectangular AT-cut crystal oscillating piece 4 which is provided at its both ends with a bevel portion 4a. The bevel portion 4a is sandwiched between the opposed pointed ends 3a, 3a of the channel-shaped support 3 so as to support the crystal oscillating piece 4 by means of the channel-shaped support 3. The optimum supporting position of the oscillating piece 4 becomes different depending on the configuration or cut orientation of the oscillating piece 4.

In the case of a crystal oscillating piece 4 composed of an AT-cut crystal having a cut orientation of 35° 3', for example, and having dimensions of 6 mm length×1.6 mm width×0.4 mm thickness and a bevel portion 4a inclined at an angle of 4° to 6° with respect to the axial direction of the crystal piece, it is suitable to support the osicillating piece 4 at that position of the bevel portion 4a which is distant apart from the end surface of the bevel portion 4a by 0.3 mm to 0.4 mm.

The oscillating piece 4 is provided at its center part with an electrode 5 vapor deposited thereon. The electrode 5 is connected at its one end to a lead portion 5a for covering the bevel portion 4a. The lead portion 5a is brought into point or line contact with the opposed pointed portions 3a, 3a of the supporting member 3 in an electrically conductive relation. It is preferable to secure the lead portion 5a to the opposed pointed portions 3a, 3a of the supporting member 3 by soldering, hot pressure bonding, spot welding or the like for the purpose of firmly securing the oscillating piece 4 to the supporting member 3 and establishing an electrical conduction therebetween in a reliable manner. Reference numeral 6 designates a metal cap hermetically secured to the base plate 1. A space surrounded by the base plate 1 and the cap 6 is maintained under a reduced pressure of the order of 1 Torr.

Experimental tests have yielded the result that the thickness shear piezoelectric oscillator comprising the AT-cut crystal oscillating piece constructed as above described has a $R_1$ value of lower than 40Ω and a Q value of larger than 150,000.

Figure 4:
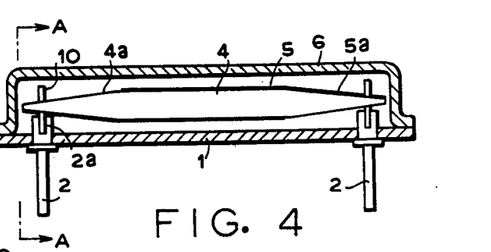
FIG. 4 is a cross-sectional view of a second embodiment of a thickness shear piezoelectric oscillator according to the invention.
Figure 5:
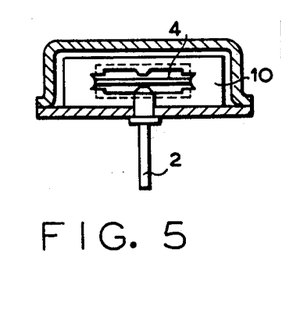
FIG. 5 is a section on line A—A of FIG. 4.
Figure 6:
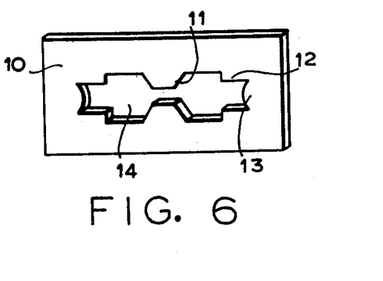
FIG. 6 is an enlarged perspective view of a supporting member shown in FIG. 4.

FIGS. 4 to 6 show a second embodiment of a thickness shear piezoelectric oscillator according to the invention. A crystal oscillating piece 4, insulating base plate 1, lead terminal 2, bevel portion 4a, electrode 5, lead portion 5a and cap 6 are the same in construction as those of the embodiment shown in FIG. 3. But, the distance between the two lead terminals 2, 2 of the present embodiment is slightly narrower than that of the embodiment shown in FIG. 3. The lead terminal 2 is provided at its upper portion with a slit 2a into which is firmly engaged a thin sheet-shaped supporting member 10 as shown in FIG. 5. The supporting member 10 is composed of a rectangular thin plate having a thickness of the order of 0.1 mm to 0.3 mm and provided at its center part with a slit 14 surrounded by opposed projections 11, opposed stepped portions 12 and opposed arcuate portions 13. The distance between the opposed projections 11, 11 is made equal to the thickness of the node of the bending oscillation of the bevel portion 4a of the oscillating piece 4. The distance between the opposed stepped portions 12, 12 and the distance between the opposed arcuate portions 13, 13 are determined such that the oscillating piece 4 supported by the supporting member 10 is spaced apart from respective portion by a distance on the order of 5 to 50μ.

The present embodiment has a number of advantages. In the first place, the effect is substantially the same as that of the embodiment shown in FIG. 3. Secondly, the supporting member 10 can be subjected to the etching treatment and is easily workable. Third, the oscillating piece 4 can reliably be supported by the supporting member 10 and has an excellent shock resistant property. Fourth, the length of the oscillating piece 4 in its lengthwise direction can be made shorter than that of the embodiment shown in FIG. 3. Finally, one of the opposed projections 11, 11 may be secured to the electrode lead portion 5a so as to improve the stability of the resonance frequency.

Figure 7:
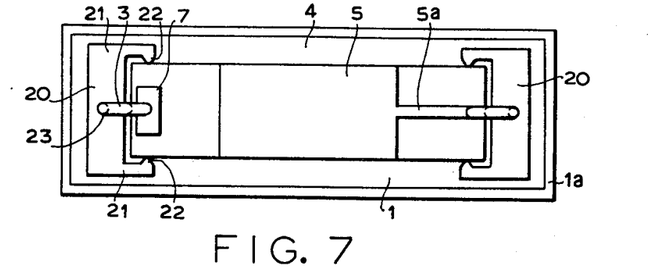
FIG. 7 is a plan view of a third embodiment of a thickness shear piezoelectric oscillator according to the invention with a cap removed.
Figure 8:
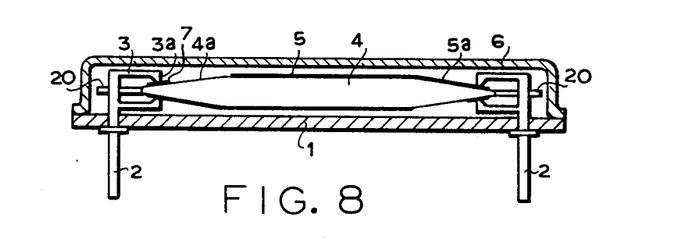
FIG. 8 is a cross-sectional view of the oscillator shown in FIG. 7 with the cap fitted.

FIGS. 7 and 8 show a third embodiment of a thickness shear piezoelectric oscillator according to the invention. In the present embodiment, use is made of a supporting member 3 which is the same as that of the embodiment shown in FIG. 3 for the purpose of supporting the oscillating piece 4 in its upper and lower directions and connecting the electrode lead 5a thereto. The supporting member 3 is also provided with a second supporting member 20 which functions to determine the position of the oscillating piece 4 in its horizonal direction, that is, the position in two directions parallel to the plane surface of the oscillating piece 4. The second supporting member 20 is composed of an E-shaped thin plate including two end legs which are provided at their front ends with opposed projections 22, 22. The second supporting member 20 is provided at its intermediate portion with a projection 23 which is the same as the projections 21, 21 and which functions to determine the position of the oscillating piece 4 in its horizontal direction. The second supporting member 20 is secured to and made integral with the support 3. It is preferable to form the opposed projections 22, 22 of the second supporting member 20 such that these oppositions 22, 22 correspond to the node of the bending oscillation of the bevel portion 4a of the oscillating piece 4. In the present embodiment, that portion of the bevel portion 4a which is not provided with the electrode lead portion 5a is provided with an auxiliary film 7 deposited from vapor phase under vacuum or the like and adapted to be secured to the pointed portion 3a of the first supporting member 3. If the first supporting member 3 is secured to such auxiliary film 7, it is possible to omit the second supporting member 20. Reference numeral 1a designates a metal film vapor deposited on the periphery of the substrate 1 and adapted to be easily engaged with the cap 6.

The present embodiment constructed as above described, has a number of advantages. In the first place, it is possible to improve the oscillation characteristic of the oscillating piece 4. Secondly, the oscillating piece 4 can reliably be supported by the lead terminal 2. Third, the shock resistant property can be improved. Fourth, it is easily workable. Finally, the thickness in the upper and lower directions may be made thinner than that of the previous embodiment shown in FIGS. 4, 5 and 6.

Figure 9:
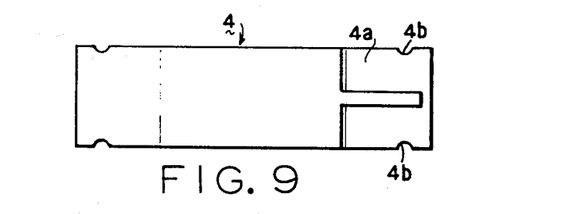
FIG. 9 is a plan view of an oscillating piece for a fourth embodiment of a thickness shear piezoelectric oscillator according to the invention.
Figure 10:
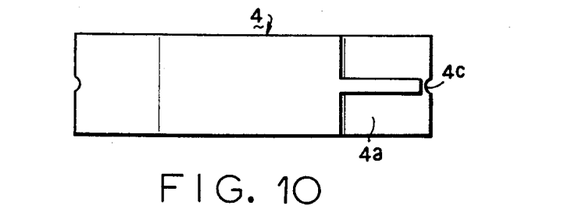
FIG. 10 is a plan view of an oscillating piece for a fifth embodiment of a thickness shear piezoelectric oscillator according to the invention.

FIGS. 9 and 10 show oscillating pieces for fourth and fifth embodiments of a thickness shear piezoelectric oscillator according to the invention, respectively. In the embodiment shown in FIG. 9, the bevel portion $4a$ of the oscillating piece 4 is provided at its node point located at the side surface thereof with incisions $4b$, $4b$. In the embodiment shown in FIG. 10 the bevel portion $4a$ of the oscillating piece 4 is provided at its end surface with an incision $4c$.

Figure 11:
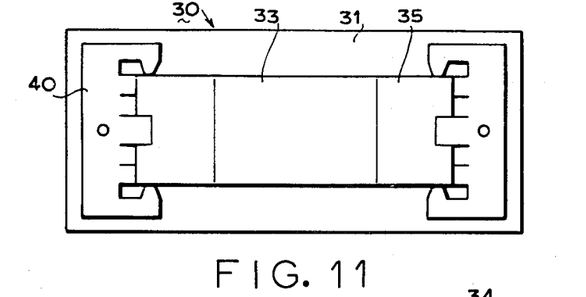
FIG. 11 is a plan view of a sixth embodiment of a thickness shear piezoelectric oscillator according to the invention with a cap removed.
Figures 12, 13:
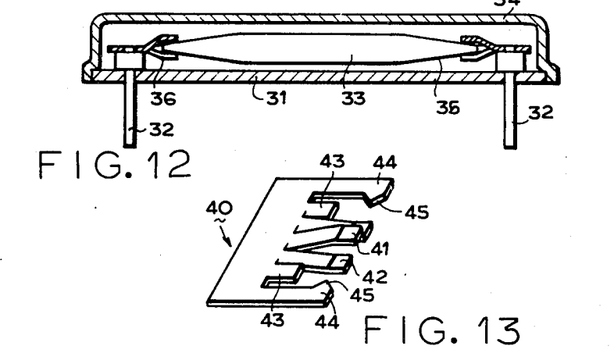
FIG. 12 is a cross-sectional view of the oscillator shown in FIG. 11 with a cap fitted.
FIG. 13 is an enlarged perspective view of a supporting member shown in FIG. 11.

FIGS. 11 and 12 show a sixth embodiment of a thickness shear piezoelectric oscillator according to the invention. FIG. 11 is a plan view of an oscillator as a whole with its cap removed and FIG. 12 is its cross-sectional view with the cap fitted. In the present embodiment, an oscillator 30 is composed of a base plate 31 formed of an insulating material such as ceramic, glass or the like, two fixed terminals 32, 32 extending through the base plate 31 and hermetically secured thereto so as to form lead terminals, supporting members 40, 40 secured to the fixed terminals 32, 32, respectively, and for holding the oscillating piece 33 therebetween, and a cap 32 hermetically engaged with the base plate 31. The oscillating piece 33 is formed of an AT-cut crystal, BT-cut crystal or the like and functions mainly in a thickness shear oscillation mode. The oscillating piece 33 is composed of a rectangular flat plate which is provided at its ends in the lengthwise direction thereof with wedge-shaped bevel portions 35, 35, respectively. As shown in FIG. 13, the supporting member 40 is composed of an electrically conductive thin plate formed by press, etching or the like and provided at its center part with a center resilient piece 41 and two side resilient pieces 42, 42. The center resilient piece 41 is bent upwardly from its base and provided at its free end with a horizontally exending portion. Each of the two side resilient portions 42, 42 is bent downwardly from its base and provided at its free end with a horizontally extending portion. In addition, the supporting member 40 is provided outside the two side resilient portions 42, 42 with a pair of tongue-shaped first position determining pieces 43, 43 and with a pair of second position determining 44, 44 in the order as mentioned above. The first position determining pieces 43, 43 have a dimension determined such that the end 36 of the oscillating piece 33 is slightly urged against the front end of the first position determining pieces 43, 43 when the front ends of the resilient pieces 41, 42, 42 are located at the immovable point of the oscillating piece 33. The second position determining piece 44, 44 are provided at their free ends with pointed portions 45, 45, respectively. It is preferable to locate the pointed portions 45, 45 on an extension of a line connecting the free ends of the resilient pieces 41, 42, 42 with each other.

In the oscillator which makes use of the support structure constructed as above described, the first and second position determining pieces 43, 43, 44, 44 function to always hold the oscillating piece 33 a given position. As a result, the resilient pieces 41, 42, 42 are not required to firmly hold the front end 36 of the oscillating piece 33 which has been encountered with the prior art techniques. In addition, in the support structure of the present embodiment, the dimension of various parts thereof may suitably be selected such that the immovable point of the oscillating piece 33 is always sandwiched between the free ends of the resilient pieces 41, 42, 42. As a result, the thickness shear piezoelectric oscillator of the present embodiment which makes use of the support structure constructed as above described has a synergetic effect of holding the front end 36 of the oscillating piece 33 between the free ends of the resilient pieces 41, 42, 42 under a low clamping pressure and of holding the immovable point of the oscillating piece 33 between the free ends of the latter, and has a large Q value and small $R_1$ value. For example, in the case of a crystal oscillator formed of 4 MHz AT-cut crystal having a dimension of 6 mm length×1.6 mm width×0.4 mm thickness, Q is larger than 200,000 and $R_1$ is smaller than 100 Ω.

Figure 14:
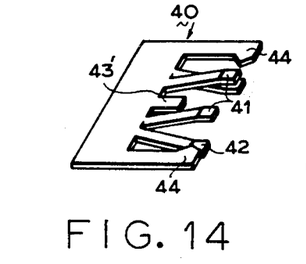
FIGS. 14 and 15 are perspective views of modified embodiments of the supporting member shown in FIG. 13.
Figure 15:
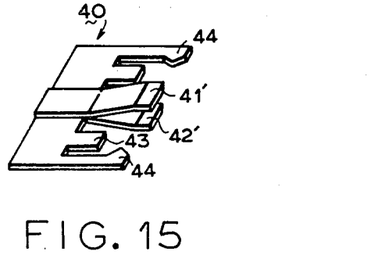

FIGS. 14 and 15 show two modified embodiments of the supporting member 40 shown in FIG. 13. In the embodiment shown in FIG. 14, a supporting member 40 is provided at its center portion with a first position determining piece 43' and outside the first position determining piece 43' with resilient pieces 41, 41, 42, 42 in the order as mentioned.

In the embodiment shown in FIG. 15, a supporting member 40 is provided at its center portion with two separate resilient pieces 41', 42' secured to the upper and lower surfaces of the supporting member 40, respectively, and outside the resilient pieces 41', 42' with first and second position determining pieces 43, 44 in the order as mentioned above. The function and effect of the embodiments shown in FIGS. 14 and 15 are the same as that of the embodiment shown in FIG. 13.

Figure 16:
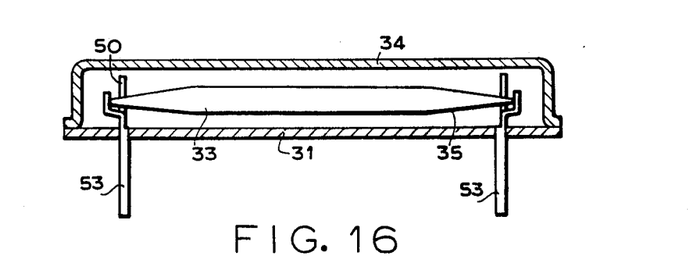
FIG. 16 is a cross-sectional view of a seventh embodiment of a thickness shear piezoelectric oscillator according to the invention.
Figure 17:
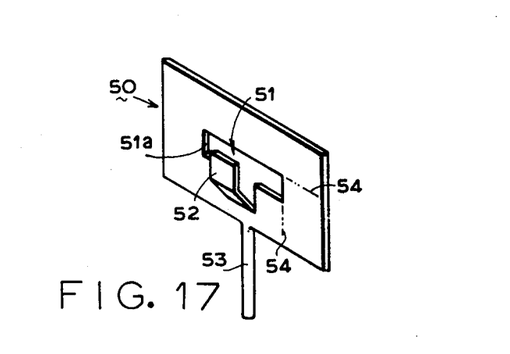
FIG. 17 is an enlarged perspective view of a supporting member shown in FIG. 16.

FIGS. 16 and 17 show a seventh embodiment of a thickness shear piezoelectric oscillator according to the invention. In the present embodiment, an oscillating piece 33 is supported through a supporting member 50 by a base plate 31 and a cap 34 is hermetically secured to the base plate 31. As shown in FIG. 17, the supporting member 50 is composed of a rectangular thin plate and provided at its center with a slit 51 adapted to insert therein and support the front end of the bevel portion 35 of the oscillating piece 33. The slit 51 is of T-shaped one and provided at the base of a center slit portion with a tongue-shaped position determining piece 52 made integral with the supporting member 50 and bent upwardly from the base of the center slit portion. The tongue-shaped position determining piece 52 extends obliquely upwardly and is provided at its free end with a vertically extending portion. The lower part of the supporting member 50 is connected to a stationary terminal 53 which functions as a lead terminal. The dimension of the slit 51 is determined such that the side surfaces $51a$ of the slit 51 uniformly makes contact with the immovable point of the oscillating piece 33 and functions to support it without forming any gap therebetween. A better result may be obtained if the side surfaces $15a$ are made circular or are provided with an edge portion. The position determining piece 52 is so formed that the end surface of the oscillating piece 33 is slightly urged against it when the oscillating piece 33 is inserted into the slit 51 until the immovable point thereof makes contact with the side surfaces $51a$ of the slit 51. In order to support the oscillating piece 33 by the two supporting members 50, 50, the supporting member 50 may be resiliently deformed outwardly. If the immovable point of the oscillating piece 33 is considerably distant apart inwardly from the end surface thereof, the slit 51 of the supporting member 50 may be provided at its one end with two cuts 54 as shown by dot and dash lines. In this case, the oscillating piece 33 is laterally inserted into the slit 51 by opening the cuts 54 and after insertion the opened cuts are closed to its original state.

The above described support construction shown in FIGS. 16 and 17 is the same in effect as the above described sixth embodiment shown in FIGS. 11 to 15. In addition, the supporting member 50 is simple in construction and easy in manufacture and can rigidly support the oscillating piece 33.

Figure 18:
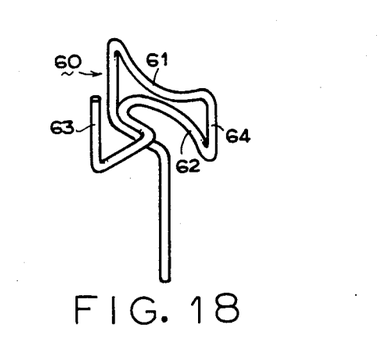
FIG. 18 is an enlarged perspective view of a modified embodiment of the supporting member shown in FIG. 17.

FIG. 18 shows a modified embodiment of the embodiment shown in FIGS. 16 and 17. In the present embodiment, a supporting member 60 as a whole is composed of a thin electrically conductive wire. The supporting wire 60 is bent to form a pair of opposed convex portions 61, 62 for sandwiching the oscillating piece therebetween, a first position determining portion 63 projected outwardly from the opposed convex portions 61, 62 and then extending upwardly and a second position determining portion 64, 64 composed of a pair of vertically extending portions. The dimensions of these portions are determined in the same manner as in the case of the sixth and seventh embodiments.

The modified embodiment shown in FIG. 18 functions to exhibit the same effect as that described with reference to the previous embodiments and, since the supporting member 60 is composed of a thin bent wire, is less expensive and has an excellent shock resistant property.

Figure 19:
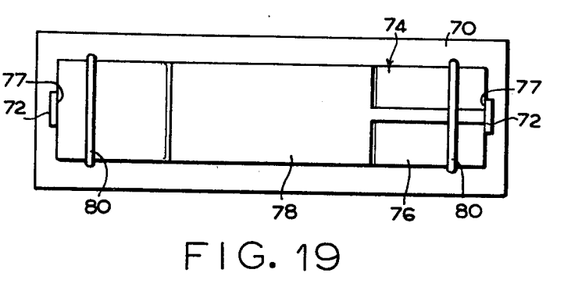
FIG. 19 is a plan view of an eighth embodiment of a thickness shear piezoelectric oscillator according to the invention with a cap removed.

FIG. 19 is a plan view of an eighth embodiment of a thickness shear piezoelectric oscillator according to the invention with a cap removed. The present embodiment comprises an insulating base plate 70 formed of an electrical insulating material such as ceramic, glass or the like and a pair of end supporting members 72, 72 secured to the upper surface of the base plate 70. To the end supporting members 72, 72 are secured both ends of a rectangular AT-cut crystal piece 74 by means of electrically conductive bonding agent 77 such as silver paste or the like, respectively. The both end portions of the crystal piece 74 are made tapered toward the end surfaces so as to form upper and lower bevel portions 76, 76. The crystal piece 74 is provided at its upper and lower surfaces with electrodes 78, 78 vapor deposited thereon. The both end supporting members 72, 72 are provided at their inner ends with a pair of bevel portion supporting members 80, 80 which are so formed that the bevel portions 76, 76 of the crystal piece 74 are sandwiched therebetween respectively. That is, the bevel portion supporting member 80 is composed of a thin metal wire having a diameter of 0.15 to 0.2 mm and bent into a frame including upper and lower convex portions 82, 82 facing each other. This frame is secured to the base plate 70 by fixing means such as bonding, soldering or the like. The configuration of the bevel portion supporting member 80 and the position of securing it to the base plate 70 are determined such that that point of the crystal piece 74 which is supported by the bevel portion supporting member 80 is coincident with the node point of the high degree bending oscillation as experimentally or analytically determined in response to the configuration of the crystal piece 74. Reference numeral 84 designates a cap for hermetically sealing the crystal piece 74 and 86 a lead terminal electrically connected through the end supporting member 72 to the electrode 78.

Figure 20:
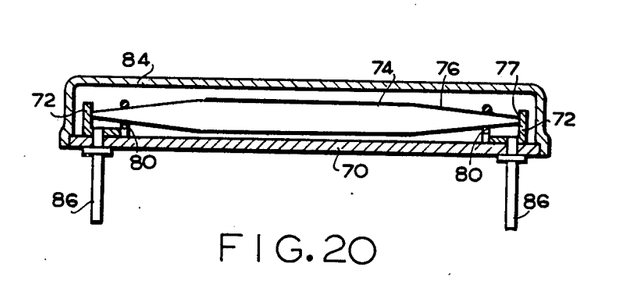
FIG. 20 is a cross-sectional view of the oscillator shown in FIG. 18 with the cap fitted.

The embodiment shown in FIGS. 18 to 20 can determine the position of the crystal piece 74 in its horizontal direction in a reliable manner by securing both ends of the crystal piece 74 to the end supporting member 72 by means of the electrically conductive bonding agent 77 and can determine the position of the crystal piece 74 in its vertical direction by means of the bevel portion supporting member 80, and as a result, the crystal piece 74 can firmly be supported by the supporting member and the shock resistant property of the oscillator can remarkably be improved. That is, the change in the resonance frequency before and after dropping down movement of the oscillator from a position having a height of 1 m onto a wooden plate can be made smaller than ±0.5 PPM. In addition, the conventional oscillator comprising the crystal piece having the above mentioned dimension ratio and supported by its ends only exhibited a Q value of $3.5 \times 10^4$ to $5 \times 10^4$ and an equivalent series resistance $R_1$ value of 300 to 500 $\Omega$. On the contrary, the present embodiment is capable of obtaining a Q value of $15 \times 10^4$ to $20 \times 10^4$ and a $R_1$ value of smaller than 100 $\Omega$ in a relatively easy manner.

Figure 22:
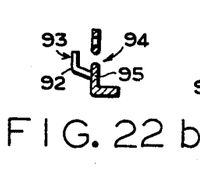

FIGS. 22a and 22b show a supporting member for use in a ninth embodiment of a thickness shear piezoelectric oscillator according to the invention. In the present embodiment, a supporting member 90 is composed of an end supporting portion 92 and a bevel supporting portion 94 made integral with the end supporting portion 92. For this purpose, use is made of a thin L-shaped plate which is provided at its vertically extending portion 95 with L-shaped end supporting portions 92, 92 having vertically extending portions 93, 93, respectively. The vertically extending portion 95 is locally cut out to form windows 97, 98 with a resilient arcuate portion 99 remained therebetween. Both the resilient arcuate portion 99 and the upper end surface of the vertically extending portion 95 facing the window 97 are made circular in section as shown in FIG. 22b.

Figure 21:
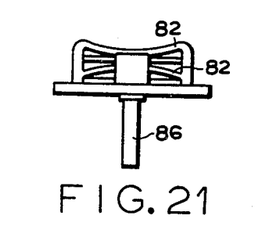
FIG. 21 is an end view of FIG. 19.

In the present embodiment, the supporting member 90 can support the crystal piece substantially in the same manner as in the case of the previous embodiment shown in FIGS. 19 to 21. That is, the end surface of the crystal piece is secured to the end supporting member 92 by means of a suitable bonding agent and the vertically extending portion 95 and the resilient arcuate portion 99 constitute a bevel supporting member 94 which functions to sandwich that position of the crystal piece which is located inwardly from the end surface of the crystal piece therebetween and which exhibits its most improved characteristic. That point of the crystal piece which exhibits its most improved characteristic changes in dependence with the configuration of the crystal piece. For example, the best result was obtained when a square AT-cut crystal piece having a dimension of 6.0 mm length × 1.6 mm width × 0.4 mm thickness and provided with a bevel portion inclined at an angle of 6.5° to 7.5° to the center axis of the crystal piece and with a flat portion having a length of 3.3 to 3.5 mm was supported at a position distant part from its end surface by 0.35 to 0.4 mm by a bevel supporting member.

In general, it is the most convenient to experimentally determine the optimum supporting position of the crystal piece. Such optimum supporting position may also be determined by an analytical method or a theoretical calculation using finite element method in a sufficiently precise manner.

In the above described ninth embodiment shown in FIGS. 22a and 22b, the resilient arcuate portion 99 is resilient, so that the oscillator becomes easy in assembling. In addition, the supporting member 90 is made into one integral body, so that the cost of the oscillator becomes less expensive.

Figure 23:
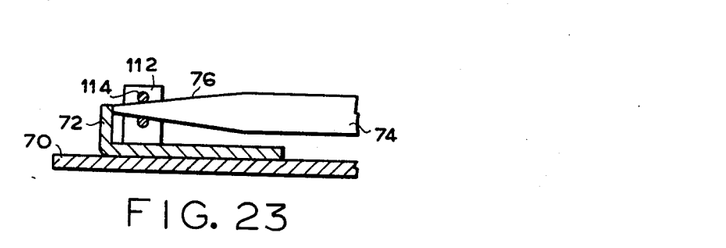
FIG. 23 is a cross-sectional view of main parts of a tenth embodiment of a thickness shear piezoelectric oscillator according to the invention.

FIG. 23 shows main parts of a tenth embodiment of a thickness shear piezoelectric oscillator according to the invention. The present embodiment comprises an insulating base plate 70, two end supporting members 72, 72 secured to the base plate 70, a crystal 74 having end surfaces secured to the end supporting members 72, 72 by bonding, and two thin wires 114, 114 extending between a pair of vertically extending portions 112, 112 projected from the base plate 70 and distant apart from each other by a given distance, these two thin wires 114, 114 sandwiching a bevel portion 76 of the crystal piece 74 therebetween. The end supporting member 72 and the vertically extending portions 112, 112 may be made into one integral body formed of a thin plate.

Figure 24:
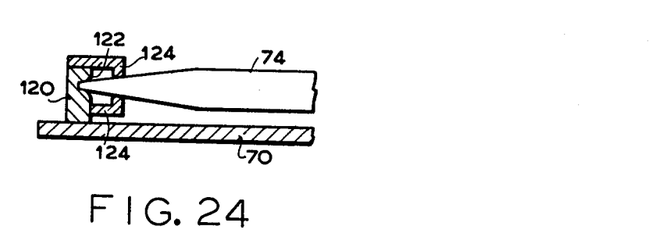
FIG. 24 is a cross-sectional view of main parts of an eleventh embodiment of a thickness shear piezoelectric oscillator according to the invention.

FIG. 24 shows main parts of an eleventh embodiment of a thickness shear piezoelectric oscillator according to the invention. The present embodiment comprises an insulating base plate 70, and end supporting member 120 secured to the base plate 70 and provided with a V-shaped groove 112, a crystal piece 74 having ends engaged with the V-shaped groove 112 and supported by the end supporting member 120, and a pair of L-shaped bevel supporting members 124, 124 secured to the end supporting member 120 and sandwiching the upper and lower bevel portions of the crystal piece 74 therebetween.

Figure 25:
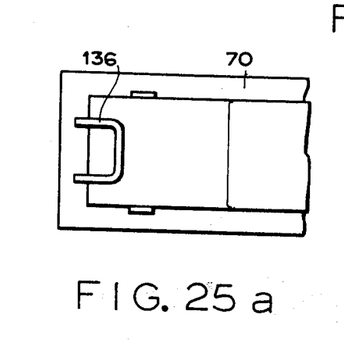

FIG. 25 shows a twelfth embodiment of a thickness shear piezoelectric oscillator according to the invention. In the present invention, an end supporting member 132 and a bevel supporting member 134 are made into one integral body formed of a thin plate which is subjected to shearing and bending working processes. The bevel supporting member 134 is composed of a vertically extending channel-shaped portion 136 which is provided at a vertical portion perpendicular to its lengthwise direction with a slit into which is inserted the crystal piece 74. The end supporting member 132 is composed of a raising-up portion extending in parallel with its lengthwise direction and provided with a slit 138 into which is inserted the end surface of the crystal piece 74. The crystal piece 74 is provided at its two sides with raising-up portions 139, 139 for restricting the lateral displacement of the crystal piece 74.

In the present embodiment, the crystal piece 74 can laterally be inserted into the slit 138 with the supporting member 130 secured to the base plate 70 and then raisingup portion 139 is bent so as to determine the position of the crystal piece 74, thereby assembling the oscillator in an easy manner.

In the above embodiment, the crystal AT-cut piece has been used as the oscillating piece. The oscillating piece is not limited to the crystal AT-cut piece only, but may be formed of a crystal BT-cut, AC-cut, BC-cut piece or any thickness shear piezoelectric oscillator other than the crystal piece.

As stated hereinbefore, the thickness shear piezoelectric oscillator according to the invention comprises an oscillating piece provided at its both ends with upper and lower bevel portions, the oscillating piece being supported at a node point of the bending oscillation of the bevel portions by a point or line contact. As a result, the invention provides a thickness sliding piezoelectric oscillator which has a large Q value and a small $R_1$ value, which is extremely small in size and which is sufficiently excellent in characteristics for an oscillator for wrist watches allowable space of which is extremely small.

In addition, the supporting member for supporting the oscillating piece is provided with a supporting member for supporting the node point of the oscillating piece in its thickness direction and with a position determining means for determining the position of the oscillating piece in a direction perpendicular to the thickness thereof. As a result, the invention is capable of providing thickness shear piezoelectric oscillator which can support the node point of the bending oscillation of the end portion of the oscillating piece by a slight contact pressure of the supporting member. Moreover, the thickness shear piezoelectric oscillator according to the invention can not only improve the oscillating characteristics, i.e., Q value, $R_1$ value, etc. but also can significantly improve the shock resistant property and hence is applicable to a wrist watch which tends to be often subjected to violent shock when in use.

What is claimed is:

1. A thickness shear piezoelectric oscillator comprising:
   (a) an insulating base plate;
   (b) a lead terminal extending through said insulating base plate and secured thereto;
   (c) a supporting means provided at that portion of said lead terminal which is extended through and projected from said insulating base plate;
   (d) an oscillation piece provided at its both ends with bevel portions and having a node point of bending oscillation of the upper and lower surfaces of said bevel portions, said node point being supported by said supporting means;
   (e) an electrode provided at the center part of said oscillating piece;
   (f) a lead portion formed on said oscillating piece and for electrically connecting said electrode to said lead terminal;
   (g) a cap secured to said insulating base plate and hermetically covering said oscillating piece;
   (h) the end surface of said bevel portion of said oscillating piece is supported by a horizontal position determining means for the purpose of determining the position of said oscillating piece in its horizontal direction;
   (i) said horizontal position determining means is provided in a direction perpendicular to the direction of providing said supporting means;
   (j) said horizontal position determining means is comprised of a thin plate having two legs terminating in opposed projections, said projections engaging the sides of the oscillating piece; and
   (k) the supporting means includes opposing supporting members for engaging the upper and lower surfaces of said bevel portions for vertically supporting the oscillating piece.

2. A thickness shear piezoelectric oscillator comprising:
   (a) an insulating base plate;
   (b) a lead terminal extending through said insulating base and secured thereto;
   (c) a supporting means provided at that portion of said lead terminal which is extended through and projected from said insulating base plate;
   (d) an oscillating piece provided at its both ends with bevel portions and having a node point of bending oscillation of the upper and lower surfaces of said bevel portions, said node point being supported by said supporting means;
   (e) an electrode provided at the center part of said oscillating piece;
   (f) a lead portion formed on said oscillating piece and for electrically connecting said electrode to said lead terminal;

(g) a cap secured to said insulating base plate and hermetically covering said oscillating piece, wherein (h) said supporting means comprises horizontal position determining means for determining the position of said oscillating piece in its horizontal direction;

(i) said horizontal position determining means comprising a thin plate having two legs terminating in opposed projections, said projections engaging the sides of the oscillating piece.

3. An oscillator as recited in claim 2 wherein said opposing supporting members comprise first and second bent extensions projection from said plate, one of said extensions being upwardly bent and having a horizontal end section, said upwardly and downwardly bent extensions resiliently engaging a node point of said oscillating piece.

4. An oscillator as recited in claim 3 further comprising at least one extension projecting from said plate, shorter than said bent extensions, for engaging and positioning an end of said oscillating piece in a longitudinal direction.

5. A thickness shear piezoelectric oscillator comprising:

(a) an insulating base plate;

(b) a lead terminal extending through said insulating base plate and secured thereto;

(c) a supporting means provided at that portion of said lead terminal which is extended through and projected from said insulating base plate;

(d) an oscillating piece provided at its both ends with bevel portions and having a node point of bending oscillation of the upper and lower surfaces of said bevel portions, said node point being supported by said supporting means;

(e) an electrode provided at the center part of said oscillating piece;

(f) a lead portion formed on said oscillating piece and for electrically connecting said electrode to said lead terminal; and (g) a cap secured to said insulating base plate and hermetically covering said oscillating piece, wherein (h) said supporting means comprises a wire frame having upper and lower convex portions facing each other and engaging the upper and lower surfaces of said bevel portions, respectively.

6. An oscillator as recited in claim 5 wherein said wire frame is formed of a single wire, having one end vertically disposed for engaging an end of said oscillating piece.

7. A thickness shear piezoelectric oscillator comprising:

(a) an insulating base plate;

(b) a lead terminal extending through said insulating base plate and secured thereto;

(c) a supporting means provided at that portion of said lead terminal which is extended through and projected from said insulating base plate;

(d) an oscillating piece provided at its both ends with bevel portions and having a node point of bending oscillation of the upper and lower surfaces of said bevel portions, said node point being supported by said supporting means;

(e) an electrode provided at the center part of said oscillating piece;

(f) a lead portion formed on said oscillating piece and for electrically connecting said electrode to said lead terminal; and (g) a cap secured to said insulating base plate and hermetically covering said oscillating piece, wherein (h) said supporting means is comprised of an upper L-shaped portion for engaging the upper surface of said bevel portion and a lower resilient arcuate portion for engaging the lower surface of said bevel portion.

8. A thickness shear piezoelectric oscillator comprising:

(a) an insulating base plate;

(b) a lead terminal extending through said insulating base plate and secured thereto;

(c) a supporting means provided at the portion of said lead terminal which is extended through and projected from said insulating base plate;

(d) an oscillating piece provided at its both ends with bevel portions and having a node point of bending oscillation of the upper and lower surfaces of said bevel portions, said node point being supported by said supporting means;

(e) an electrode provided at the center part of said oscillating piece;

(f) a lead portion formed on said oscillating piece and for electrically connecting said electrode to said lead terminal; and (g) a cap secured to said insulating base plate and hermetically covering said oscillating piece, wherein (h) said supporting means comprises a pair of vertically extending portions projecting from a base plate and having two wires extending between the vertically extending portions, the wires forming a slit therebetween for engaging the upper and lower surfaces of said bevel portions.

9. A thickness shear piezoelectric oscillator comprising:

(a) an insulating base plate;

(b) a lead terminal extending through said insulating base plate and secured thereto;

(c) a supporting means provided at that portion of said lead terminal which is extended through and projected from said insulating base plate;

(d) an oscillating piece provided at its both ends with bevel portions and having a node point of bending oscillation of the upper and lower surfaces of said bevel portions, said node point being supported by said supporting means;

(e) an electrode provided at the center part of said oscillating piece;

(f) a lead portion formed on said oscillating piece and for electrically connecting said electrode to said lead terminal;

(g) a cap secured to said insulating base plate and hermetically covering said oscillating piece, wherein said supporting means comprises (h) a vertically extending channel shaped portion having a slit for supporting the bevel portion of said oscillating piece, and an end support connected to said channel shaped portion, (i) said end support having a slit for receiving an end portion of said oscillating piece.

* * * * *